(12) United States Patent
Ji et al.

(10) Patent No.: US 10,978,458 B2
(45) Date of Patent: *Apr. 13, 2021

(54) SEMICONDUCTOR DEVICE INCLUDING ULTRA LOW-K SPACER AND METHOD FOR FABRICATING THE SAME

(71) Applicant: SK hynix Inc., Gyeonggi-do (KR)

(72) Inventors: Yun-Hyuck Ji, Seoul (KR); Beom-Ho Mun, Gyeonggi-do (KR); In-Sang Kim, Gyeongsangnam-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/866,760

(22) Filed: May 5, 2020

(65) Prior Publication Data
US 2020/0266198 A1    Aug. 20, 2020

Related U.S. Application Data

(63) Continuation of application No. 16/193,910, filed on Nov. 16, 2018, now Pat. No. 10,672,773.

(30) Foreign Application Priority Data

Mar. 26, 2018 (KR) .................... 10-2018-0034449

(51) Int. Cl.
| | | |
|---|---|---|
| *H01L 27/108* | (2006.01) | |
| *H01L 23/532* | (2006.01) | |
| *H01L 23/522* | (2006.01) | |
| *H01L 23/528* | (2006.01) | |

(52) U.S. Cl.
CPC .. *H01L 27/10855* (2013.01); *H01L 27/10814* (2013.01); *H01L 27/10823* (2013.01); *H01L 27/10885* (2013.01); *H01L 27/10888* (2013.01); *H01L 27/10891* (2013.01)

(58) Field of Classification Search
CPC ............... H01L 29/0649; H01L 23/528; H01L 23/5329; H01L 29/66621; H01L 27/10888; H01L 21/76897; H01L 21/76834; H01L 21/76877; H01L 29/0653; H01L 21/7682; H01L 27/10855
See application file for complete search history.

(56) References Cited

U.S. PATENT DOCUMENTS

| | | | |
|---|---|---|---|
| 2014/0061939 A1* | 3/2014 | Yu .......................... | H01L 27/108 257/774 |
| 2017/0005166 A1* | 1/2017 | Park .................. | H01L 27/10888 |
| 2017/0062347 A1* | 3/2017 | Kim .................. | H01L 21/76897 |
| 2018/0151701 A1* | 5/2018 | Chen .................. | H01L 29/0847 |

* cited by examiner

*Primary Examiner* — Brian Turner
(74) *Attorney, Agent, or Firm* — IP&T Group LLP

(57) ABSTRACT

A semiconductor device includes a bit line structure including a bit line contact plug and a bit line on the bit line contact plug, a storage node contact plug, an ultra low-k spacer including a gap-fill spacer contacting a side wall of the bit line contact plug and a line-type spacer contacting a side wall of the bit line, and a low-k spacer formed on the line-type spacer of the ultra low-k spacer to contact the storage node contact plug, wherein the gap-fill spacer is thicker than the line-type spacer.

16 Claims, 11 Drawing Sheets

SEMICONDUCTOR DEVICE INCLUDING ULTRA LOW-K SPACER AND METHOD FOR FABRICATING THE SAME

CROSS-REFERENCE TO RELATED APPLICATIONS

This application is a continuation of U.S. patent application Ser. No. 16/193,910 filed on Nov. 16, 2018, which claims benefits of priority of Korean Patent Application No. 10-2018-0034449 filed on Mar. 26, 2018. The disclosure of each of the foregoing application is incorporated herein by reference in its entirety.

BACKGROUND

1. Field

The present invention relates generally to a semiconductor device and a method for fabricating the same. More particularly, the present invention relates to a semiconductor device including an ultra low-k spacer and a method for fabricating the semiconductor device.

2. Description of the Related Art

In a semiconductor device, a dielectric material is formed between neighboring pattern structures. As the level of integration of a semiconductor device increases, the distance between neighboring pattern structures gradually decreases. As a result, parasitic capacitance is gradually increasing. As the parasitic capacitance increases, the performance of the semiconductor device decreases.

According to an existing method for decreasing the parasitic capacitance, decreasing the dielectric constant of the dielectric material is introduced to reduce the parasitic capacitance. However, since the dielectric material is required to have a relatively high dielectric constant, this method is still limited in reducing the parasitic capacitance.

Therefore, there is a need to develop innovative ways to more decrease the parasitic capacitance of highly integrated semiconductor devices.

SUMMARY

Exemplary embodiments of the present invention are directed to a semiconductor device capable of reducing parasitic capacitance between neighboring pattern structures, and a method for fabricating the semiconductor device.

In accordance with an embodiment of the present invention, a semiconductor device includes: a bit line structure including a bit line contact plug and a bit line on the bit line contact plug, a storage node contact plug, an ultra low-k spacer including a gap-fill spacer contacting a side wall of the bit line contact plug and a line-type spacer contacting a side wall of the bit line, and a low-k spacer formed on the line-type spacer of the ultra low-k spacer to contact the storage node contact plug, wherein the gap-fill spacer is thicker than the line-type spacer.

In accordance with an embodiment of the present invention, a method for fabricating a semiconductor device includes: forming a bit line structure including a bit line contact plug on a semiconductor substrate and a bit line on the bit line contact plug; forming an ultra low-k layer on a side wall of the bit line structure; forming a low-k layer on the ultra low-k layer; forming a low-k spacer located on a side wall of the bit line by etching the low-k layer; and forming an ultra low-k spacer including a gap-fill spacer contacting the bit line contact plug and a line-type spacer formed parallel to the side wall of the bit line by etching the ultra low-k layer to be aligned in the low-k spacer.

DETAILED DESCRIPTION

Figure 1:
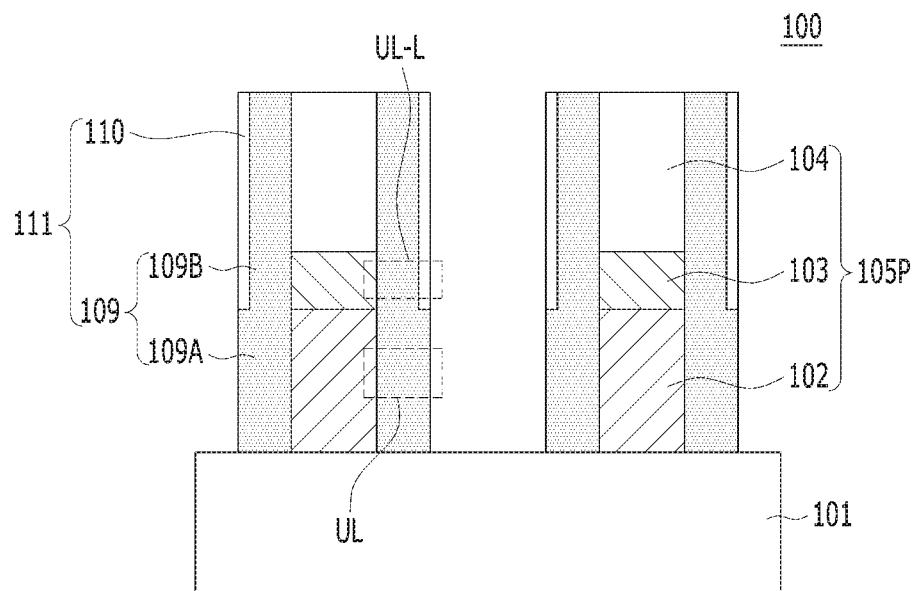
FIG. 1 is a cross-sectional view of a semiconductor device in accordance with an embodiment of the present invention.

Various examples and implementations of the disclosed technology are described below in detail with reference to the accompanying drawings.

The drawings may not necessarily be to scale and in some instances, proportions of structures in the drawings may have been exaggerated to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. Throughout the disclosure, like reference numerals refer to like parts in the various figures and embodiments of the present invention.

In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exist or are added.

Figure 2:
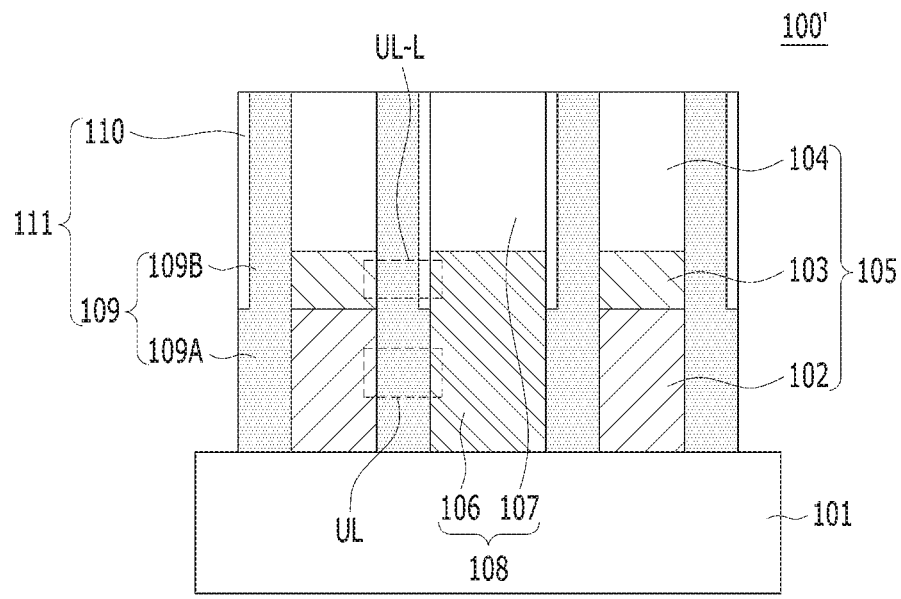
FIG. 2 is a cross-sectional view of a semiconductor device in accordance with an embodiment of the present invention.

FIG. 1 is a cross-sectional view of a semiconductor device 100 in accordance with an embodiment of the present invention. FIG. 2 is a cross-sectional view of a semiconductor device 100' in accordance with an embodiment of the present invention. Constituent elements of a dielectric structure 111 shown in FIGS. 1 and 2 may be the same.

Referring to FIG. 1, the semiconductor device 100 may include a substrate 101, a plurality of pattern structures 105P, and a dielectric structure 111 formed on both side walls of each of the pattern structures 105P.

The plurality of pattern structures 105P may be formed on the substrate 101. Each of the pattern structures 105P may include a first conductive pattern 102 formed on the substrate 101. The pattern structure 105P may further include a second conductive pattern 103 formed on the first conductive pattern 102, and a hard mask pattern 104 formed on the second conductive pattern 103. The first conductive pattern 102 may be in direct contact with the substrate 101. Although not illustrated, the first conductive pattern 102 and the substrate 101 may be electrically isolated by an isolation material layer or a dielectric material layer. The first conductive pattern 102 and the second conductive pattern 103 may include polysilicon, a metal, a metal nitride, a metal silicide or combinations thereof. The hard mask pattern 104 may include a dielectric material.

The dielectric structure 111 may include a multi-layer dielectric material. The dielectric structure 111 may include a first dielectric material 109 located on side walls of the first conductive pattern 102. The dielectric structure 111 may further include a second dielectric material 110 formed on the first dielectric material 109. The second dielectric material 110 may be located on side walls of the second conductive pattern 103 with the first dielectric material 109 therebetween. The first dielectric material 109 may contact the side walls of the first and second conductive patterns 102 and 103. The first dielectric material 109 may include a thick portion 109A and a thin portion 109B. The thick portion 109A may be thicker than the thin portion 109B. A bottom of the second dielectric material 110 may contact a top surface of the thick portion 109A of the first dielectric material 109. The thick portion 109A of the first dielectric material 109 may contact the side walls of the first conductive pattern 102. The thin portion 109B of the first dielectric material 109 may contact the side walls of the second conductive pattern 103. A portion of the thin portion 109B may contact the side walls of the hard mask pattern 104.

As described above, a single layer comprised of the first dielectric material 109 may be formed on the side walls of the first conductive pattern 102, and a bilayer comprised of the first dielectric material 109 and the second dielectric material 110 may be formed on the side walls of the second conductive pattern 103.

The dielectric structure 111 may be referred to as a "spacer structure". The dielectric structure 111 may include a multi-layer spacer.

Referring to FIG. 2, the semiconductor device 100' may include a substrate 101, a first pattern structure 105, a second pattern structure 108, and a dielectric structure 111 formed between the first pattern structure 105 and the second pattern structure 108.

The first pattern structure 105 and the second pattern structure 108 may be formed on the substrate 101. The dielectric structure 111 may be formed between the first pattern structure 105 and the second pattern structure 108. The second pattern structure 108 may be located between two neighboring first pattern structures 105.

The first pattern structure 105 may be the same as the first pattern structure 105P shown in FIG. 1. The first pattern structure 105 may include a first conductive pattern 102 formed on the substrate 101. The first pattern structure 105 may further include a second conductive pattern 103 formed on the first conductive pattern 102, and a hard mask pattern 104 formed on the second conductive pattern 103.

The second pattern structure 108 may include a third conductive pattern 106. The second pattern structure 108 may further include a fourth conductive pattern 107 formed on the third conductive pattern 106.

The dielectric structure 111 may include a multi-layer dielectric material. The dielectric structure 111 may include a first dielectric material 109 located between the first conductive pattern 102 and the third conductive pattern 106. The first dielectric material 109 may be extended to be located between the second conductive pattern 103 and the third conductive pattern 106. The dielectric structure 111 may further include a second dielectric material 110. The second dielectric material 110 may be located on side walls of the second conductive pattern 103 on the first dielectric material 109. The first dielectric material 109 may include a thick portion 109A and a thin portion 109B. The thick portion 109A may be thicker than the thin portion 109B. A bottom of the second dielectric material 110 may contact a top surface of the thick portion 109A of the first dielectric material 109. The thick portion 109A of the first dielectric material 109 may contact side walls of the first conductive pattern 102. The thin portion 109B of the first dielectric material 109 may contact the side walls of the second conductive pattern 103.

As described above, the first dielectric material 109 may be formed between the first conductive pattern 102 and the third conductive pattern 106. The first dielectric material 109 and the second dielectric material 110 may be formed between the second conductive pattern 103 and the third conductive pattern 106.

The dielectric structure 111 may be referred to as a "spacer structure" or a "low-k spacer structure". Accordingly, the dielectric structure 111 may include a multi-layer spacer.

The dielectric structure 111 shown in FIG. 1 may have a dielectric constant which decreases parasitic capacitance between the neighboring pattern structures 105P. The dielectric structure 111 shown in FIG. 2 may have a dielectric constant which decreases parasitic capacitance between the first pattern structure 105 and the second pattern structure 108.

In FIGS. 1 and 2, each of the first dielectric material 109 and the second dielectric material 110 may have a low dielectric constant (low-k). The first dielectric material 109 may have a first low dielectric constant. The second dielectric material 110 may have a second low dielectric constant. The first low dielectric constant may be lower than the second low dielectric constant. The second low dielectric constant may be equal to or lower than 5, and the first low dielectric constant may be equal to or lower than 3.5. The second low dielectric constant may be lower than a dielectric constant (approximately 7.5) of a silicon nitride. The first low dielectric constant may be lower than a dielectric constant (approximately 3.9) of a silicon oxide. Accordingly, the first low dielectric constant may be referred to as an "ultra low-k".

The first dielectric material 109 may be referred to as an "ultra low-k spacer", and the second dielectric material 110 may be referred to as a "low-k spacer".

The first dielectric material 109 and the second dielectric material 110 may be different materials.

The first dielectric material 109 may include a silicon-based material. The first dielectric material 109 may include any one impurity selected from carbon and boron. The low dielectric constant of the first dielectric material 109 may be obtained by the impurity. The first dielectric material 109 may include an impurity-containing silicon-based material. The impurity-containing silicon-based material may include a carbon-doped silicon-based material or a boron-doped silicon-based material. The impurity-containing silicon-based material may include silicon carbon oxide (SiCO) or silicon boron nitride (SiBN). The carbon-doped silicon-based material may have a low carbon concentration. This may be referred to as a "low carbon-doped silicon-based material". The low carbon-doped silicon-based material may include low carbon-SiCO. The boron-doped silicon-based material may have a high boron concentration. This may be referred to as a "high boron-doped silicon-based material". The high boron-doped silicon-based material may include high boron-SiBN. An etch rate of the first dielectric material 109 may be low by the impurity.

The first dielectric material 109 may have a sufficiently large thickness. Since the first dielectric material 109 has the low dielectric constant, it is advantageous in reducing the parasitic capacitance. The large thickness of the first dielectric material 109 is advantageous for reducing the parasitic capacitance. The thickness of the first dielectric material 109 may be greater than that of the second dielectric material 110.

The first dielectric material 109 may have a lower dielectric constant than a silicon oxide ($SiO_2$) and a silicon nitride ($Si_3N_4$).

The second dielectric material 110 may include a silicon-based material. The second dielectric material 110 may include at least one impurity selected from carbon, boron and a combination thereof. The low dielectric constant of the second dielectric material 110 may be obtained by the impurity. The second dielectric material 110 may include an impurity-containing silicon-based material. The impurity-containing silicon-based material may include silicon carbide (SiC), silicon carbon nitride (SiCN) or silicon boron carbon nitride (SiBCN). The impurity-containing silicon-based material may include SiCO having a high carbon concentration. This may be referred to as "high carbon-SiCO". Accordingly, each of the first dielectric material 109 and the second dielectric material 110 may include SiCO. However, the first dielectric material 109 may have a lower carbon concentration than the second dielectric material 110. An etch rate of the second dielectric material 110 may be low by the impurity.

The second dielectric material 110 may be thinner than the thin portion 109B of the first dielectric material 109.

The etch rate of the second dielectric material 110 may be lower than an etch rate of a conventional silicon nitride ($Si_3N_4$). For this reason, the second dielectric material 110 may be deposited thin. Accordingly, a thickness of the first dielectric material 109 may be increased to contribute to a reduction in the parasitic capacitance.

The dielectric structure 111 may include an ultra low-k/low-k (UL-L) structure and an ultra low-k (UL) structure. The UL structure may be formed by the thick portion 109A of the first dielectric material 109. The UL-L structure may be formed by stacking the thin portion 109B of the first dielectric material 109 and the second dielectric material 110.

In FIGS. 1 and 2, the semiconductor devices 100 and 100' may be parts of a memory cell.

The first conductive pattern 102 included in the pattern structure 105P and first pattern structure 105 may be a first contact plug. The second conductive pattern 103 may be a conductive line. The second pattern structure 108 may be a second contact plug. The first dielectric material 109 and the second dielectric material 110 may decrease parasitic capacitance between the first contact plug and the second contact plug. In addition, the dielectric structure 111 may decrease parasitic capacitance between the conductive line and the second contact plug.

Each of the pattern structure 105P and the first pattern structure 105 may be a bit line structure. The first conductive pattern 102 may be a bit line contact plug. The second conductive pattern 103 may be a bit line. The second pattern structure 108 may be a storage node contact plug. The dielectric structure 111 may be a bit line spacer. Accordingly, the dielectric structure 111 may decrease parasitic capacitance between the bit line contact plug and the storage node contact plug. The dielectric structure 111 may decrease parasitic capacitance between the bit line and the storage node contact plug.

In some embodiments, each of the first conductive pattern 102 and the second conductive pattern 103 may be a gate electrode of a transistor. The second pattern structure 108 may be a contact plug coupled to a source/drain region of the transistor. The dielectric structure 111 may be a gate spacer or a contact spacer. Accordingly, the dielectric structure 111 may decrease parasitic capacitance between the gate electrode and the contact plug.

In some embodiments, the pattern structure 105P may be a metal line having a line shape. Accordingly, the dielectric structure 111 may decrease parasitic capacitance between neighboring metal lines.

Figure 3:
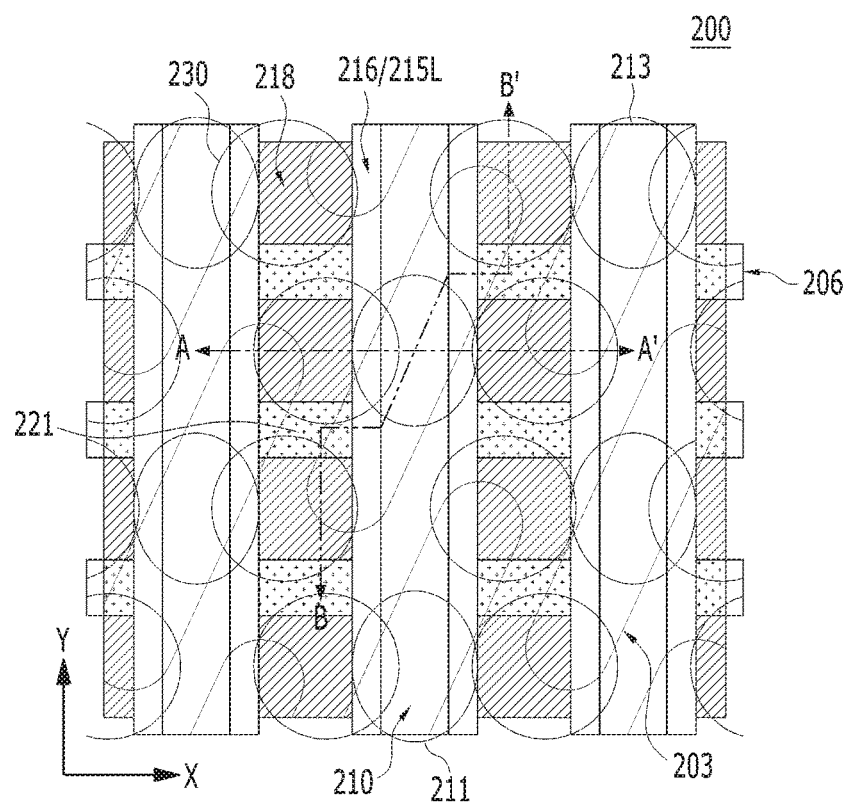
FIG. 3 is a plan view illustrating a semiconductor device in accordance with an embodiment of the present invention.
Figure 4A:
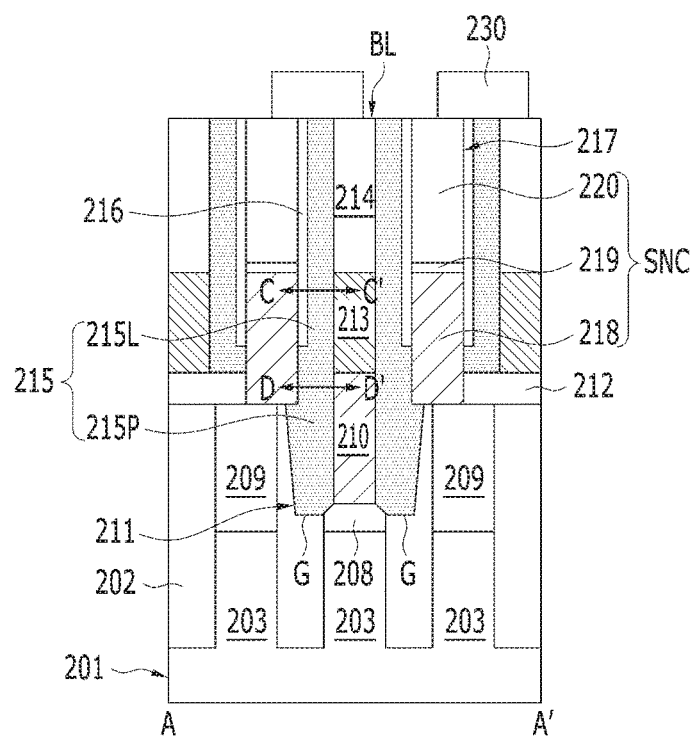
FIG. 4A is a cross-sectional view of a semiconductor device shown in FIG. 3 taken along a line A-A'.
Figure 4B:
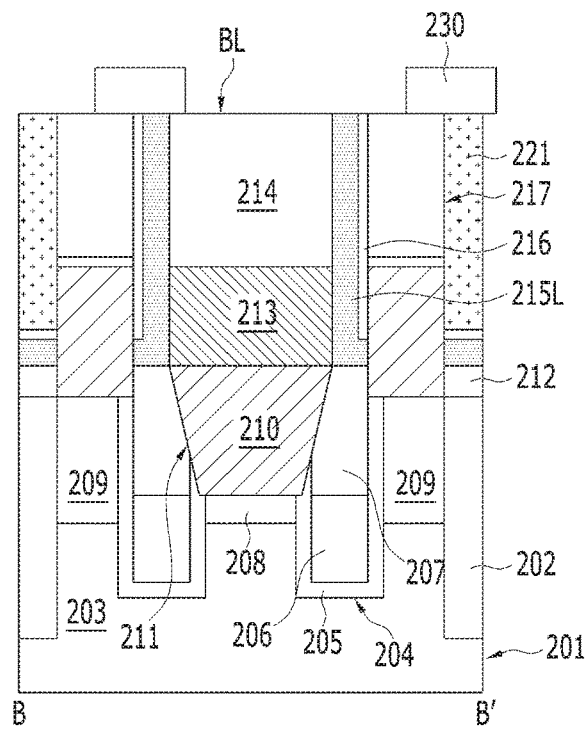
FIG. 4B is a cross-sectional view of a semiconductor device shown in FIG. 3 taken along a line B-B'.
Figure 4C:
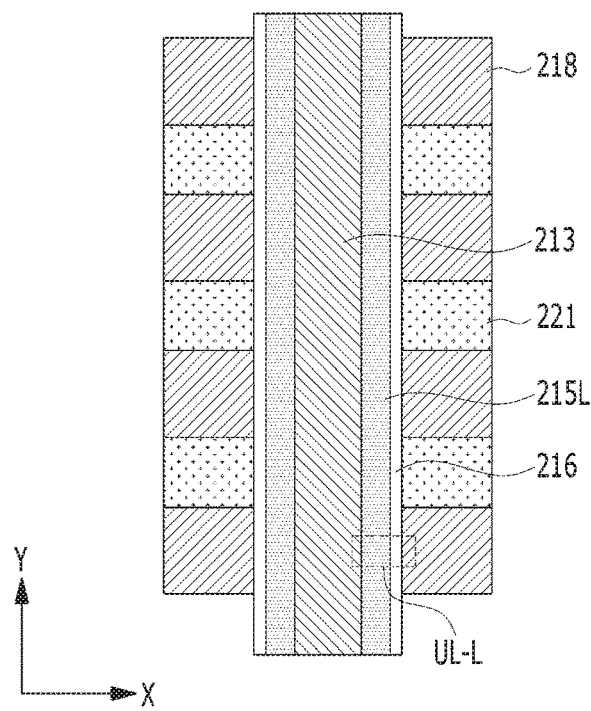
FIG. 4C is a plan view of a semiconductor device shown in FIG. 4A taken along a line C-C'.
Figure 4D:
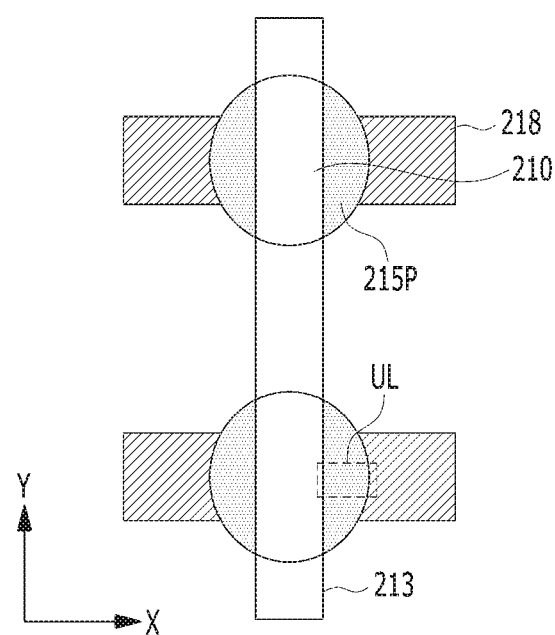
FIG. 4D is a plan view of a semiconductor device shown in FIG. 4A taken along a line D-D'.

FIG. 3 is a plan view illustrating a semiconductor device 200 in accordance with an embodiment of the present invention. FIG. 4A is a cross-sectional view of the semiconductor device 200 shown in FIG. 3 taken along a line A-A'. FIG. 4B is a cross-sectional view of the semiconductor device 200 shown in FIG. 3 taken along a line B-B'. FIG. 4C is a plan view of the semiconductor device 200 shown in FIG. 4A taken along a line C-C'. FIG. 4D is a plan view of the semiconductor device 200 shown in FIG. 4A taken along a line D-D'.

The semiconductor device 200 may include a plurality of memory cells. Each of the memory cells may include a cell transistor including a buried word line 206, a bit line 213, and a memory element 230.

An isolation layer 202 and an active region 203 may be formed in a substrate 201. A plurality of active regions 203 may be defined by the isolation layer 202. The substrate 201 may be include a material suitable for semiconductor processing. The substrate 201 may include a semiconductor substrate. The substrate 201 may be formed of a material containing silicon. The substrate 201 may include silicon, single crystal silicon, polysilicon, amorphous silicon, silicon germanium, single crystal silicon germanium, polycrystal silicon germanium, silicon doped with carbon, combinations thereof or multi layers thereof. The substrate 201 may include a semiconductor material such as germanium. The substrate 201 may include a III/V kind semiconductor substrate, for example, a compound semiconductor substrate such as GaAs. The substrate 201 may include a silicon on insulator (SOI) substrate. The isolation layer 202 may be formed by a shallow trench isolation (STI) process.

A gate trench 204 may be formed in the substrate 201. A gate dielectric layer 205 may be formed conformally on a surface of the gate trench 204. The buried word line 206 that partially fills the gate trench 204 may be formed on the gate dielectric layer 205. A gate capping layer 207 may be formed on the buried word line 206. A top surface of the buried word line 206 may be at a lower level than a surface of the substrate 201. The buried word line 206 may be a low resistance metal material. In some embodiments, the buried word line 206 may be sequentially stacked of a titanium nitride and tungsten. In some embodiments, the buried word line 206 may be formed of a titanium nitride (TiN) only. The buried word line 206 may be referred to as a "buried gate electrode".

First and second impurity regions 208 and 209 may be formed in the substrate 201. The first and second impurity regions 208 and 209 may be spaced apart from each other by the gate trench 204. The first and second impurity regions 208 and 209 may be referred to as source/drain regions. The first and second impurity regions 208 and 209 may include an N-type impurity such as arsenic (As) or phosphorus (P). Accordingly, the buried word line 206 and the first and second impurity regions 208 and 209 may be cell transistors. The cell transistors may improve a short channel effect through the buried word line 206.

A bit line contact plug 210 may be formed on the substrate 201. The bit line contact plug 210 may be coupled to the first impurity region 208. The bit line contact plug 210 may be located in a bit line contact hole 211. The bit line contact hole 211 may be formed in a hard mask layer 212. The hard mask layer 212 may be formed on the substrate 201. The hard mask layer 212 may include a dielectric material. The bit line contact hole 211 may expose the first impurity region 208. A bottom surface of the bit line contact plug 210 may be lower than a top surface of the substrate 201. The bit line contact plug 210 may be formed of polysilicon or a metal material. A portion of the bit line contact plug 210 may have a smaller line width than a diameter of the bit line contact hole 211. The bit line 213 may be formed on the bit line contact plug 210 and a bit line hard mask 214 may be formed on the bit line 213. A stack structure of the bit line contact plug 210, the bit line 213 and the bit line hard mask 214 may be referred to as a "bit line structure BL". The bit line 213 may have a line shape extended in a direction intersecting the buried word line 206. A portion of the bit line 213 may be coupled to the bit line contact plug 210. In an A-A' direction, the bit line 213 and the bit line contact plug 210 may have the same line width. Accordingly, the bit line 213 may be extended in any one direction while covering the bit line contact plug 210. The bit line 213 may include a metal material. The bit line hard mask 214 may include a dielectric material.

A first low-k spacer 215 may be formed on side walls of the bit line contact plug 210. A second low-k spacer 216 may be formed on the first low-k spacer 215. The first low-k spacer 215 may be formed on both side walls of the bit line contact plug 210. The first low-k spacer 215 may be extended to be formed between the bit line 213 and the second low-k spacer 216. The bit line contact hole 211 may be filled with the bit line contact plug 210 and the first low-k spacer 215. The bit line contact hole 211 may include a gap G defined on both sides of the bit line contact plug 210. The first low-k spacer 215 may fill inside of the gap G. The second low-k spacer 216 may be extended parallel to both side walls of the bit line 213.

A storage node contact plug SNC may be formed between neighboring bit line structures BL. The storage node contact plug SNC may be formed in a storage node contact hole 217. The storage node contact hole 217 may have a high aspect ratio. The storage node contact plug SNC may be coupled to the second impurity region 209. The storage node contact plug SNC may include a bottom plug 218 and a top plug 220. The storage node contact plug SNC may further include an ohmic contact layer 219 between the bottom plug 218 and the top plug 220. The ohmic contact layer 219 may include a metal silicide. The bottom plug 218 may include polysilicon, and the top plug 220 may include a metal material.

When viewed in a direction parallel to the bit line structure BL, a plug isolation layer 221 may be formed between neighboring storage node contact plugs SNC. The plug isolation layer 221 may be formed between the neighboring bit line structures BL, and provide the storage node contact hole 217 together with the hard mask layer 212. The neighboring storage node contact plugs SNC may be isolated by the plug isolation layer 221. A plurality of plug isolation layers 221 and a plurality of storage node contact plugs SNC may be alternately located between the neighboring bit line structures BL.

The memory element 230 may be formed on the top plug 220. The memory element 230 may include a capacitor including a storage node. The storage node may include a pillar type. Although not illustrated, a dielectric layer and a plate node may be formed on the storage node. The storage node may be of a cylinder type other than the pillar type.

The first low-k spacer 215 and the second low-k spacer 216 are described in detail below.

The first low-k spacer 215 may be formed on side walls of the bit line structure BL. The first low-k spacer 215 may contact the side walls of the bit line 213. A bottom portion of the first low-k spacer 215 may be extended to contact the side walls of the bit line contact plug 210. The bottom portion of the first low-k spacer 215 may fill the gap G. A pair of first low-k spacers 215 may be formed on the side walls of the bit line structure BL. The bottom portion of the first low-k spacer 215 may contact the bottom plug 218 of the storage node contact plug SNC.

The first low-k spacer 215 may include a plugging spacer 215P and a line-type spacer 215L. The second low-k spacer 216 may be formed on the first low-k spacer 215. The second low-k spacer 216 may contact the storage node contact plug SNC. The second low-k spacer 216 may not contact the bottom portion of the first low-k spacer 215. A pair of second low-k spacers 216 may be located along the side walls of the bit line 213 with line-type spacer 215L of the first low-k spacer 215 disposed therebetween.

The line-type spacer 215L may be of the same material as the plugging spacer 215P. The line-type spacer 215L may be extended vertically from the plugging spacer 215P. The plugging spacer 215P may fill inside of the gap G. The plugging spacer 215P may be referred to as a "gap-fill spacer". The plugging spacer 215P may have a larger width than the line-type spacer 215L. The plugging spacer 215P and the line-type spacer 215L may have a lower dielectric constant than the second low-k spacer 216. The line-type spacer 215L may be extended parallel to and in direct contact with the side walls of the bit line 213.

The first low-k spacer 215 and the second low-k spacer 216 may form an integral part. The plugging spacer 215P, the line-type spacer 215L and the second low-k spacer 216 may form an integral part.

The first low-k spacer 215 and the second low-k spacer 216 may be low-k materials. The second low-k spacer 216 may have a dielectric constant equal to or lower than approximately 5. The first low-k spacer 215 may have a lower dielectric constant than the second low-k spacer 216. The first low-k spacer 215 may have a dielectric constant equal to or lower than approximately 3.5.

The first low-k spacer 215 may include a silicon-based material. The first low-k spacer 215 may include any one impurity selected from carbon and boron. A low dielectric constant of the first low-k spacer 215 may be obtained by the impurity. The first low-k spacer 215 may include an impurity-containing silicon-based material. The impurity-containing silicon-based material may include a carbon-doped silicon-based material or a boron-doped silicon-based material. The impurity-containing silicon-based material may include SiCO or SiBN. The carbon-doped silicon-based material may have a low carbon concentration. This may be referred to as a "low carbon-doped silicon-based material". The low carbon-doped silicon-based material may include low carbon-SiCO. The boron-doped silicon-based material may have a high boron concentration. This may be referred to as a "high boron-doped silicon-based material". The high boron-doped silicon-based material may include high boron-SiBN. An etch rate of the first low-k spacer 215 may be low by the impurity.

The first low-k spacer 215 may have a thickness enough to fill the gap G. Although a first low-k spacer layer S1 is thick, the first low-k spacer 215 has the low dielectric constant, which is advantageous in reducing parasitic capacitance.

As described above, the first low-k spacer 215 may have a lower dielectric constant than a silicon oxide ($SiO_2$) and a silicon nitride ($Si_3N_4$).

The second low-k spacer 216 may include a silicon-based material. The second low-k spacer 216 may include at least one impurity selected from carbon, boron and a combination thereof. A low dielectric constant of the second low-k spacer 216 may be obtained by the impurity. The second low-k spacer 216 may include an impurity-containing silicon-based material. The impurity-containing silicon-based material may include SiC, SiCN or SiBCN. The impurity-containing silicon-based material may include SiCO having a high carbon concentration. This may be referred to as a "high carbon-SiCO". Accordingly, each of the first low-k spacer 215 and the second low-k spacer 216 may include SiCO. However, the first low-k spacer 215 may have a lower carbon concentration than the second low-k spacer 216. In addition, an etch rate of the second low-k spacer 216 may be low because of the impurity.

The second low-k spacer 216 may not be formed inside the gap G. The second low-k spacer 216 may cover the bit line 213 on the first low-k spacer 215. The second low-k spacer 216 may be thinner than the first low-k spacer 215.

The etch rate of the second low-k spacer 216 may be lower than an etch rate of a conventional silicon nitride ($Si_3N_4$). For this reason, the second low-k spacer 216 may be deposited thin. Accordingly, a thickness of the first low-k spacer 215 may be increased to contribute to a reduction in the parasitic capacitance.

As described above, one first low-k spacer 215 may be formed on the side walls of the bit line contact plug 210. A bilayer including the first low-k spacer layer S1 and the second low-k spacer 216 may be formed on the side walls of the bit line 213.

The first low-k spacer 215 and the second low-k spacer 216 may have a lower dielectric constant than a conventional silicon oxide. The second low-k spacer 216 may be referred to as a "low-k spacer", and the first low-k spacer 215 may be referred to as an "ultra low-k spacer".

The first low-k spacer 215 and the second low-k spacer 216 may have an ultra low-k/low-k (UL-L) structure. The first low-k spacer 215 may have an ultra low-k (UL) structure. The first low-k spacer 215 may occupy a maximum volume in the UL-L structure.

The UL-L structure may be formed by a stack structure of the line-type spacer 215L and the second low-k spacer 216. The UL structure may be formed by a stack structure of the plugging spacer 215P and the second low-k spacer 216.

Referring to FIG. 3, the first low-k spacer 215 may decrease parasitic capacitance between the bit line contact plug 210 and the bottom plug 218. Since one plugging spacer 215P having an ultra low dielectric constant is formed between the bit line contact plug 210 and the bottom plug 218, the parasitic capacitance may be further decreased.

The first low-k spacer 215 and the second low-k spacer 216 may decrease the parasitic capacitance between the bit line 213 and the bottom plug 218. The line-type spacer 215L may be thicker than the second low-k spacer 216. Since the line-type spacer 215L having an ultra low dielectric constant is dominantly included, the parasitic capacitance may be further decreased.

Since the etch rates of the first and second low-k spacers 215 and 216 are low, structural stability may be increased.

As a comparative example, only a silicon nitride may be formed between the bit line contact plug 210 and the bottom plug 218. The silicon nitride may have a dielectric constant of approximately 7.5. The silicon nitride may have a higher dielectric constant than the first and second low-k spacers 215 and 216. Accordingly, there is a limitation in reducing the parasitic capacitance between the bit line contact plug 210 and the bottom plug 218.

As another comparative example, a silicon oxide $SiO_2$ and a silicon nitride may be formed between the bit line contact plug 210 and the bottom plug 218. The silicon oxide may have a dielectric constant of approximately 3.9. A dielectric constant of the silicon oxide may be higher than the first low-k spacer 215 and lower than the second low-k spacer 216. In case of the latter comparative example, the structural stability may deteriorate due to an etch loss of the silicon oxide. In addition, since the silicon nitride is included, there is a limitation in reducing the parasitic capacitance between the bit line contact plug 210 and the bottom plug 218.

In accordance with an embodiment of the present invention, since the first low-k spacer 215 has a lower dielectric constant than the silicon oxide, a parasitic capacitance reducing effect may be increased. In addition, since the second low-k spacer 216 has a lower etch rate than silicon nitride, a loss of the spacer may be reduced.

FIGS. 5 to 18 are cross-sectional views illustrating a method for fabricating the semiconductor device 200 taken along lines A-A' and B-B' shown in FIG. 3 in accordance with an embodiment of the present invention.

Figure 5:
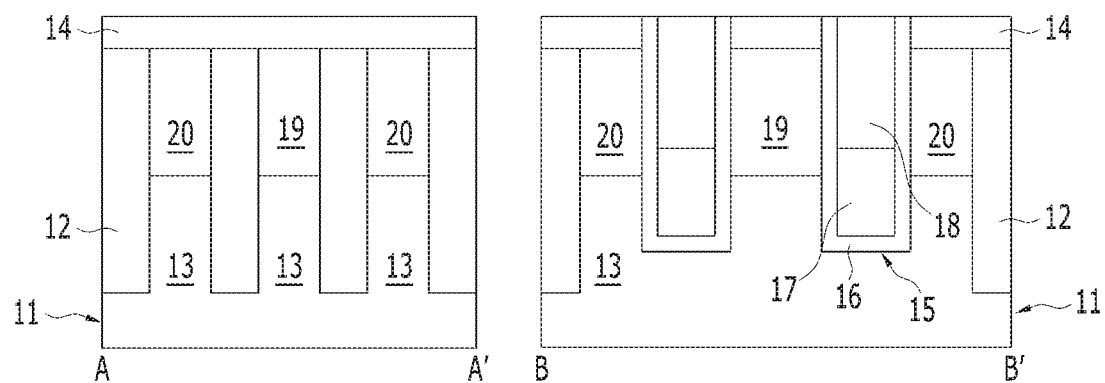
FIGS. 5 to 18 are cross-sectional views illustrating a method for fabricating a semiconductor device in accordance with an embodiment of the present invention.

Referring to FIG. 5, an isolation layer 12 may be formed in a substrate 11. An active region 13 may be defined by the isolation layer 12. The isolation layer 12 may be formed by a shallow trench isolation (STI) process. The STI process may be as follows. An isolation trench (not illustrated) may be formed by etching the substrate 11. The isolation trench may be filled with a dielectric material, and consequently the isolation layer 12 may be formed. The isolation layer 12 may include a silicon oxide, a silicon nitride or a combination thereof. A chemical vapor deposition (CVD) process or other deposition processes may be used to fill the isolation trench with a dielectric material. A planarization process such as a chemical-mechanical polishing (CMP) process may be additionally used.

Subsequently, a buried word line structure may be formed in the substrate 11. The buried word line structure may include a gate trench 15, a gate dielectric layer 16 which conformally covers a bottom surface and side walls of the gate trench 15, a buried word line 17 formed on the gate dielectric layer 16 to partially fill the gate trench 15, and a gate capping layer 18 which is formed on the buried word line 17.

A method for forming the buried word line structure may be as follows.

The gate trench 15 may be formed in the substrate 11. The gate trench 15 may have a line shape traversing the active region 13 and the isolation layer 12. The gate trench 15 may be formed by an etch process using a mask pattern (not illustrated) formed on the substrate 11 as an etch mask. In order to form the gate trench 15, a hard mask layer 14 may be used as an etch barrier. The hard mask layer 14 may have a shape patterned by the mask pattern. The hard mask layer 14 may include a silicon oxide. The hard mask layer 14 may include tetraethylorthosilicate (TEOS). A bottom surface of the gate trench 15 may be at a higher level than a bottom surface of the isolation layer 12. A depth of the gate trench 15 may be sufficient to increase an average cross-sectional area of a subsequent buried word line electrode. Accordingly, resistance of a gate electrode may decrease. In some embodiments, a bottom edge of the gate trench 15 may have a curvature. As the bottom edge of the gate trench 15 is formed to have the curvature, an irregularity may be minimized in a bottom portion of the gate trench 15, and thus filling of the gate electrode may be performed with ease.

Although not illustrated, a portion of the isolation layer 12 may be recessed, and the active region below the gate trench 15 may protrude. For example, in a line B-B' direction of FIG. 3, the isolation layer 12 below the gate trench 15 may be selectively recessed. Accordingly, a fin region (not illustrated) below the gate trench 15 may be formed. The fin region may be a portion of a channel region.

Subsequently, the gate dielectric layer 16 may be formed conformally on the bottom surface and side walls of the gate trench 15. Before the gate dielectric layer 16 is formed, an etch loss of a surface of the gate trench 15 may be cured. For example, after a sacrificial oxide is formed by a thermal oxidation process, the sacrificial oxide may be removed.

The gate dielectric layer 16 may be formed by the thermal oxidation process. For example, the gate dielectric layer 16 may be formed by oxidizing the bottom and side walls of the gate trench 15.

In some embodiments, the gate dielectric layer 16 may be formed by a deposition process such as a chemical vapor deposition (CVD) process or an atomic layer deposition (ALD) process. The gate dielectric layer 16 may include a high-k material, an oxide, a nitride, an oxynitride or combinations thereof. The high-k material may include a hafnium-containing material. The hafnium-containing material may include a hafnium oxide, a hafnium silicon oxide, a hafnium silicon oxynitride or combinations thereof. In some embodiments, the high-k material may include a lanthanum oxide, a lanthanum aluminum oxide, a zirconium oxide, a zirconium silicon oxide, a zirconium silicon oxynitride, an aluminum oxide and combinations thereof. Other high-k materials, which are well known to those skilled in the art, may be selectively used for the high-k material.

In some embodiments, after a liner polysilicon layer is deposited, the gate dielectric layer 16 may be formed by radical-oxidizing the liner polysilicon layer.

In some embodiments, after a liner silicon nitride layer is formed, the gate dielectric layer 16 may be formed by radical-oxidizing the liner silicon nitride layer.

Subsequently, the buried word line 17 may be formed on the gate dielectric layer 16. In order to form the buried word line 17, a conductive layer (not illustrated) may be formed to fill the gate trench 15, and subsequently a recessing process may be performed. The recessing process may be performed as an etch-back process or sequentially performed as the CMP process and the etch-back process. The buried word line 17 may have a recessed shape that partially fills the gate trench 15. That is, a top surface of the buried word line 17 may be at a lower level than a top surface of the active region 13. The buried word line 17 may include a metal, a metal nitride or a combination thereof. For example, the buried word line 17 may be formed of a titanium nitride (TiN), tungsten (W) or a titanium nitride/tungsten (TiN/W). In an embodiment, after titanium nitride is conformally formed, the titanium nitride/tungsten (TiN/W) may have a structure where the gate trench 15 is partially filled using tungsten. The titanium nitride may be solely used for the buried word line 17, which is referred to as the buried word line 17 having a "TiN Only" structure.

Subsequently, the gate capping layer 18 may be formed on the buried word line 17. The gate capping layer 18 may include a dielectric material. Remaining portions of the gate trench 15 on the buried word line 17 may be filled with the gate capping layer 18. The gate capping layer 18 may include a silicon nitride. In some embodiments, the gate capping layer 18 may include a silicon oxide. In some embodiments, the gate capping layer 18 may have a nitride-oxide-nitride (NON) structure. A top surface of the gate capping layer 18 may be at the same level as a top surface of the hard mask layer 14. To this end, when the gate capping layer 18 is formed, the CMP process may be performed.

After the gate capping layer 18 is formed, first and second impurity regions 19 and 20 may be formed. The first and the second impurity regions 19 and 20 may be formed by a doping process such as an implanting process. The first and second impurity regions 19 and 20 may be doped with an impurity of the same conductive type. The first and second impurity regions 19 and 20 may have the same depth. In some embodiments, the first impurity region 19 may be deeper than the second impurity region 20. The first impurity region 19 and the second impurity region 20 may be referred to as source/drain regions. The first impurity region 19 may be coupled to a bit line contact plug. The second impurity region 20 may be coupled to a storage node contact plug.

A cell transistor of a memory cell may be formed by the buried word line 17, the first impurity region 19 and the second impurity region 20.

Figure 6:
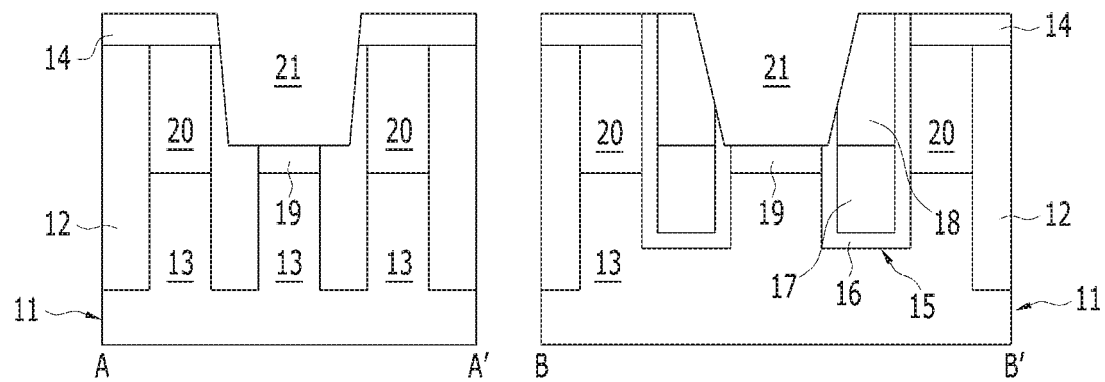

Referring to FIG. 6, a first contact hole 21 may be formed. In order to form the first contact hole 21, the hard mask layer 14 may be etched using a contact mask (not illustrated). The first contact hole 21 may have a circular shape or an oval shape in a plan view. A portion of the substrate 11 may be exposed by the first contact hole 21. The first contact hole 21 may have a diameter controlled to a predetermined line width. The first contact hole 21 may be shaped to expose a portion of the active region 13. For example, the first impurity region 19 may be exposed by the first contact hole 21. The first contact hole 21 may have a diameter larger than a minor axis width of the active region 13. Accordingly, a portion of the first impurity region 19, isolation layer 12 and gate capping layer 18 may be etched during an etch process for forming the first contact hole 21. In other words, the gate capping layer 18, the first impurity region 19 and the isolation layer 12 below the first contact hole 21 may be recessed up to a predetermined depth. Accordingly, a bottom of the first contact hole 21 may be extended into the substrate 11. As the first contact hole 21 is extended, a surface of the first impurity region 19 may be recessed, and the recessed surface of the first impurity region 19 may be at a lower level than the surface of the active region 13. The first contact hole 21 may be referred to as a bit line contact hole.

Figure 7:
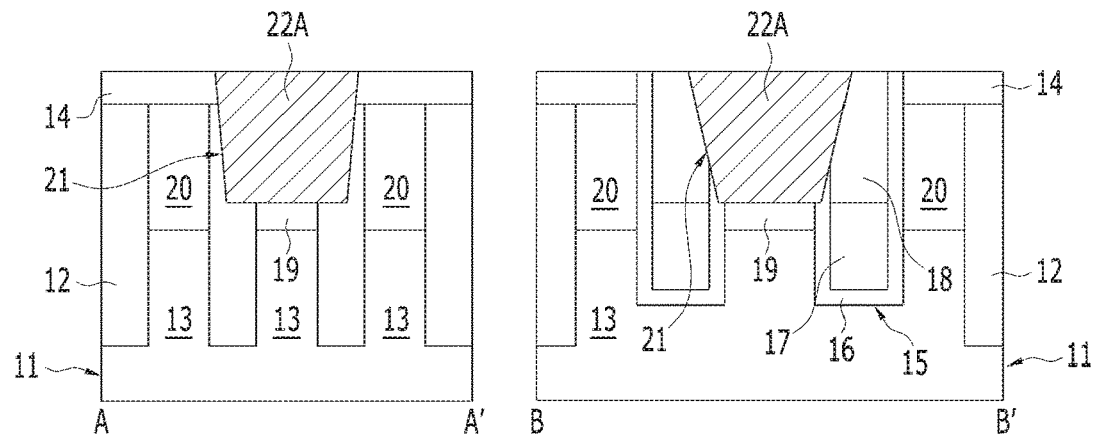

Referring to FIG. 7, a preliminary plug 22A may be formed. The preliminary plug 22A may be formed by a selective epitaxial growth (SEG) process. For example, the preliminary plug 22A may include a SEG SiP (Silicon Phosphorus). The preliminary plug 22A may be formed by the SEG process without a void. In some embodiments, the preliminary plug 22A may be formed by a polysilicon layer deposition process and the CMP process. The preliminary plug 22A may fill the first contact hole 21. A top surface of the preliminary plug 22A may be at the same level as the top surface of the hard mask layer 14.

Figure 8:
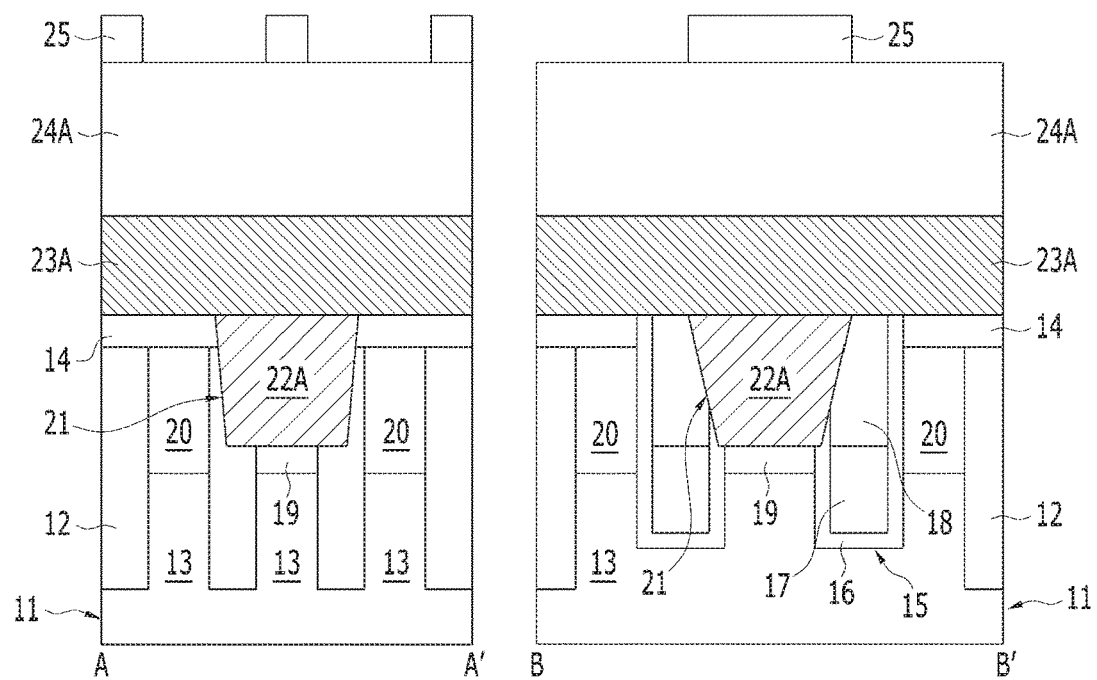

Referring to FIG. 8, a bit line conductive layer 23A and a bit line hard mask layer 24A may be sequentially stacked over the structure of FIG. 7. The preliminary plug 22A and the bit line conductive layer 23A and bit line hard mask layer 24A on the hard mask layer 14 may be sequentially stacked. The bit line conductive layer 23A may include a metal-containing material. The bit line conductive layer 23A may include a metal, a metal nitride, a metal silicide or combinations thereof. In an embodiment, the bit line conductive layer 23A may include tungsten (W). In some embodiments, the bit line conductive layer 23A may include a stacked layer of a titanium nitride and tungsten (TiN/W). The titanium nitride may serve as a barrier. The bit line hard mask layer 24A may be formed of a dielectric material having an etch selectivity over the bit line conductive layer 23A and the preliminary plug 22A. The bit line hard mask layer 24A may include a silicon oxide or a silicon nitride. In an embodiment, the bit line hard mask layer 24A may be formed of the silicon nitride.

A bit line mask layer 25 may be formed on the bit line hard mask layer 24A. The bit line mask layer 25 may include a photoresist pattern. The bit line mask layer 25 may be formed by a patterning method such as spacer patterning technology (SPT) and double patterning technology (DPT). When viewed from a top, the bit line mask layer 25 may have a line shape extending in any one direction.

Figure 9:
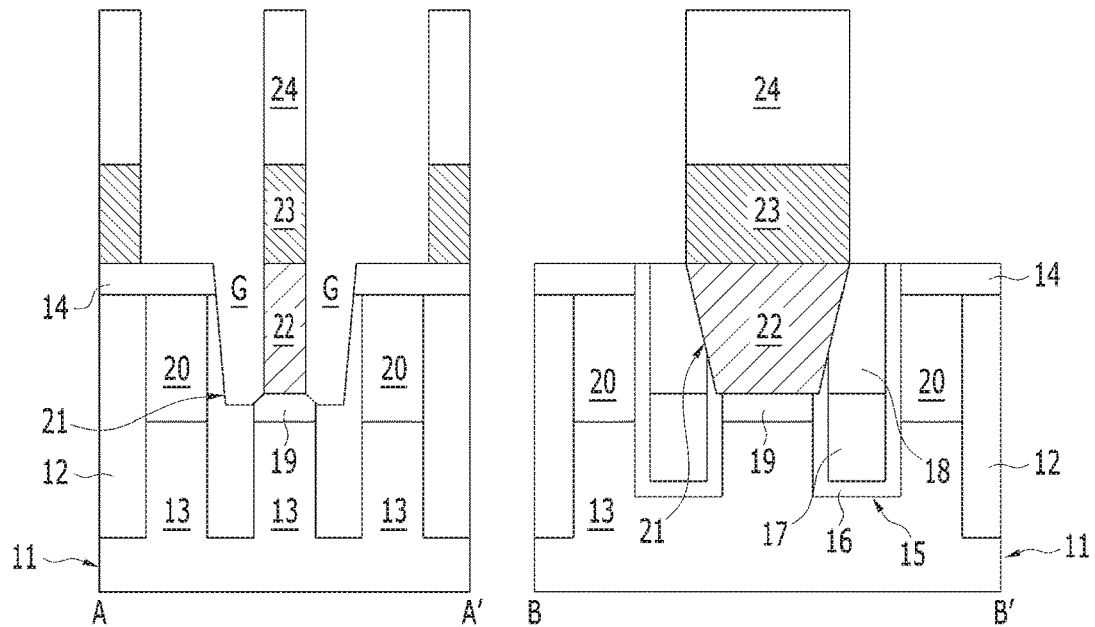

Referring to FIG. 9, a bit line 23 and a bit line contact plug 22 may be formed. The bit line 23 and the bit line contact plug 22 may be formed at the same time. The bit line 23 and the bit line contact plug 22 may be formed by an etch process using the bit line mask layer 25.

The bit line hard mask layer 24A and the bit line conductive layer 23A may be etched using the bit line mask layer 25 as an etch barrier. As a result, the bit line 23 and a bit line hard mask 24 may be formed. The bit line 23 may be formed by etching the bit line conductive layer 23A. The bit line hard mask 24 may be formed by etching the bit line hard mask layer 24A.

Subsequently, the preliminary plug 22A may be etched to have the same line width as the bit line 23. As a result, the bit line contact plug 22 may be formed. The bit line contact plug 22 may be formed on the first impurity region 19. The bit line contact plug 22 may interconnect the first impurity region 19 and the bit line 23. The bit line contact plug 22 may be formed in the first contact hole 21. A line width of the bit line contact plug 22 may be smaller than a diameter of the first contact hole 21. Accordingly, gaps G may be defined around the bit line contact plug 22.

As described above, as the bit line contact plug 22 is formed, the gaps G may be formed in the first contact hole 21. This is because the bit line contact plug 22 is etched to be smaller than the diameter of the first contact hole 21. The gaps G may be independently formed on both side walls of the bit line contact plug 22, not in a surrounding shape surrounding the bit line contact plug 22. As a result, a single bit line contact plug 22 and a pair of gaps G may be located in the first contact hole 21, and the pair of gaps G may be isolated by the bit line contact plug 22. Bottom surfaces of the gaps G may be extended to an inside of the isolation layer 12. In other words, the bottom surfaces of the gaps G may be at a lower level than the recessed top surface of the first impurity region 19.

A structure where the bit line contact plug 22, the bit line 23 and the bit line hard mask 24 are sequentially stacked may be referred to as a bit line structure. When viewed from a top, the bit line structure may be a pattern structure having a line shape.

The bit line mask layer 25 may be removed.

Figure 10:
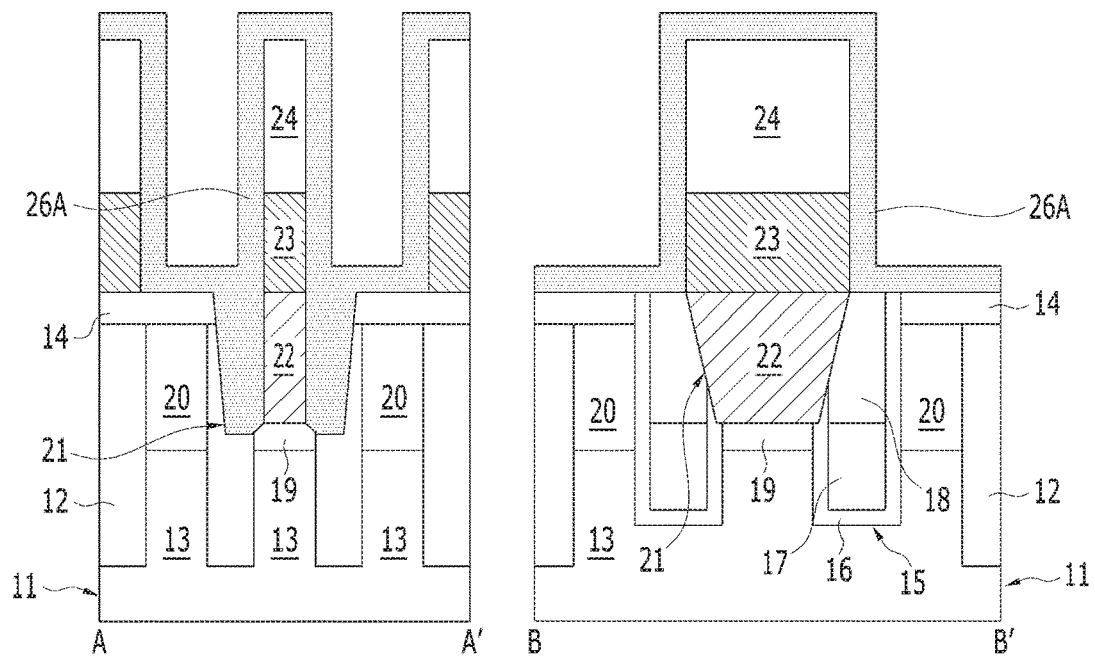

Referring to FIG. 10, a first low-k spacer layer 26A may be formed. The first low-k spacer layer 26A may cover both side walls of the bit line contact plug 22 and both side walls of the bit line 23. The first low-k spacer layer 26A may cover a top surface of the bit line hard mask 24. The first low-k spacer layer 26A may include a passivation material capable of suppressing oxidation of the bit line 23. The first low-k spacer layer 26A may include a dielectric material. The first low-k spacer layer 26A may have a low dielectric constant equal to or lower than approximately 3.5. The first low-k spacer layer 26A may include a silicon-based material. The first low-k spacer layer 26A may include any one impurity selected from carbon and boron. The low dielectric constant of the first low-k spacer layer 26A may be obtained by the impurity. The first low-k spacer layer 26A may include an impurity-containing silicon-based material. The impurity-containing silicon-based material may include a carbon-doped silicon-based material or a boron-doped silicon-based material. The impurity-containing silicon-based material may include SiCO or SiBN. The carbon-doped silicon-based material may have a low carbon concentration. This may be referred to as a "low carbon-doped silicon-based material". The low carbon-doped silicon-based material may include low carbon-SiCO. A carbon concentration of SiCO whose carbon concentration is low may be equal to or lower than 10%. The boron-doped silicon-based material may have a high boron concentration. This may be referred to as a "high boron-doped silicon-based material". The high boron-doped silicon-based material may include high boron-SiBN. An etch rate of the first low-k spacer layer 26A may be low by the impurity.

The first low-k spacer layer 26A may have a thickness enough to fill the gap G. Although the first low-k spacer layer 26A is thick, the first low-k spacer layer 26A has the low dielectric constant, which is advantageous in reducing parasitic capacitance.

As described above, the first low-k spacer layer 26A may have a lower dielectric constant than a silicon oxide ($SiO_2$).

The first low-k spacer layer 26A may be formed by the ALD process. For example, the first low-k spacer layer 26A may be formed by a SiBN ALD process or a SiCO ALD process. The SiBN ALD process may include a unit cycle comprised of $SiH_2Cl_2$(or $SiH_4$)/purge/$BCl_3$/purge/$NH_3$/purge. The SiCO ALD process may include a unit cycle comprised of $SiH_2Cl_2$(or $SiH_4$)/purge/$C_2H_4$(or $CH_4$)/purge/$O_3$/purge. $SiH_2Cl_2$ and $SiH_4$ are silicon source gases, $BCl_3$ is a boron source gas, $NH_3$ is a nitrogen source gas, and $O_3$ is an oxygen source gas. The silicon source gas, boron source gas, nitrogen source gas and the oxygen source gas may include source materials other than the aforementioned source materials.

Figure 11:
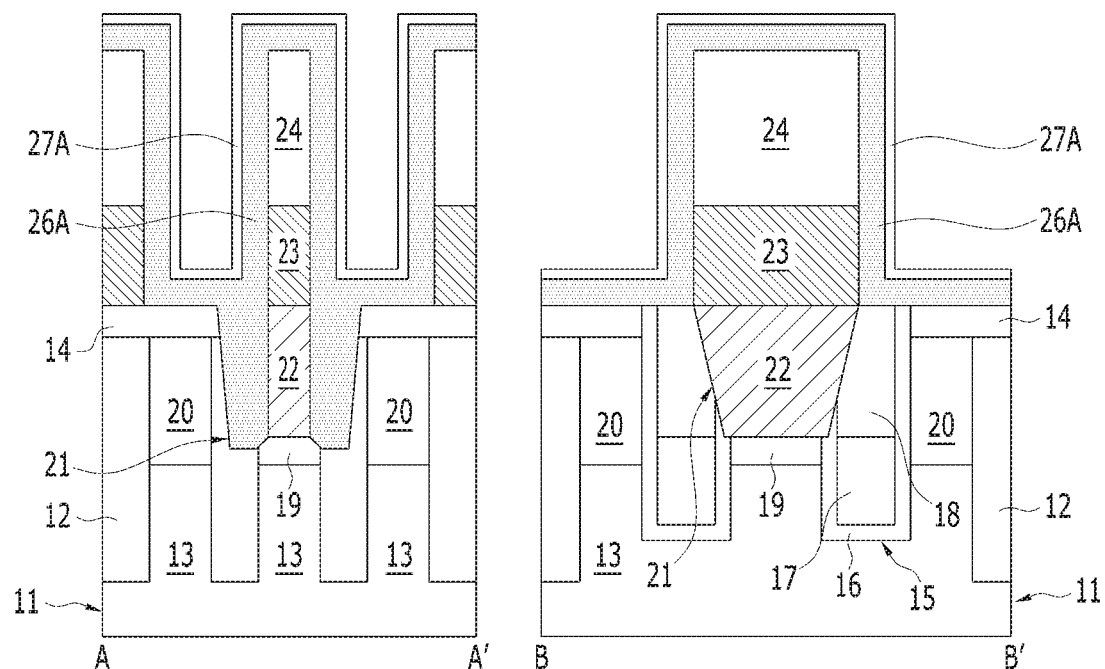

Referring to FIG. 11, a second low-k spacer layer 27A may be formed. The second low-k spacer layer 27A may be formed on the first low-k spacer layer 26A. The second low-k spacer layer 27A may have a low dielectric constant equal to or lower than 5. The second low-k spacer layer 27A may include a low-k material. The second low-k spacer layer 27A and the first low-k spacer layer 26A may be formed in-situ.

The second low-k spacer layer 27A may include a silicon-based material. The second low-k spacer layer 27A may include at least one impurity selected from carbon, boron and a combination thereof. The low dielectric constant of the second low-k spacer layer 27A may be obtained by the impurity. The second low-k spacer layer 27A may include an impurity-containing silicon-based material. The impurity-containing silicon-based material may include SiC, SiCN or SiBCN. The impurity-containing silicon-based material may include SiCO having a high carbon concentration. This may be referred to as a "high carbon-SiCO". A carbon concentration of SiCO whose carbon concentration is high may be equal to or lower than 20 atomic %. An etch rate of the second low-k spacer layer 27A may be low by the impurity.

The second low-k spacer layer 27A may be formed by the ALD process. For example, the second low-k spacer layer 27A may be formed by a SiC ALD process, a SiBCN ALD process, a SiCN ALD process or a SiCO ALD process. The SiC ALD process may include a unit cycle comprised of $SiH_2Cl_2$(or $SiH_4$)/purge/$C_2H_4$(or $CH_4$)/purge. The SiBCN ALD process may include a unit cycle comprised of $SiH_2Cl_2$ (or $SiH_4$)/purge/$BCl_3$/purge/$C_2H_4$(or $CH_4$)/purge/$NH_3$/purge. The SiCN ALD process may include a unit cycle comprised of $SiH_2Cl_2$(or $SiH_4$)/purge/$C_2H_4$(or $CH_4$)/purge/$NH_3$/purge. The SiCO ALD process may include a unit cycle comprised of $SiH_2Cl_2$(or $SiH_4$)/purge/$C_2H_4$(or $CH_4$)/purge/$O_3$/purge. $SiH_2Cl_2$ and $SiH_4$ are silicon source gases, and $BCl_3$ is a boron source gas. $NH_3$ is a nitrogen source gas, $C_2H_4$(or $CH_4$) is a carbon source gas, and $O_3$ is an oxygen source gas. The silicon source gas, boron source gas, nitrogen source gas and the oxygen source gas may include source materials other than the aforementioned source materials.

The SiCO ALD process for forming the first low-k spacer layer 26A (hereinafter referred to as a "first SiCO ALD process") may be different from the SiCO ALD process for forming the second low-k spacer layer 27A (hereinafter referred to as a "second SiCO ALD process"). The first SiCO ALD may be a unit cycle for depositing first SiCO, and the second SiCO ALD may be a unit cycle for depositing second SiCO. SiCO containing low-concentration carbon may be deposited by the first SiCO ALD process. SiCO containing high-concentration carbon may be deposited by the second SiCO ALD process.

The second low-k spacer layer 27A may not fill the gap G. The second low-k spacer layer 27A may cover the bit line structure BL on the first low-k spacer layer 26A. The second low-k spacer layer 27A may be thinner than the first low-k spacer layer 26A.

The etch rate of the second low-k spacer layer 27A may be smaller than an etch rate of a conventional silicon nitride ($Si_3N_4$). The conventional silicon nitride is an undoped silicon nitride i.e., it does not have carbon or boron dopants. Under a condition of the same dry etch process (or dry cleaning process) and wet etch process (or wet cleaning process), the etch rate of the second low-k spacer layer 27A may be smaller than the etch rate of the conventional silicon nitride. For example, in the dry etch process of $NF_3/H_2O$, the etch rate of the second low-k spacer layer 27A may be approximately 0.2 Å/250 sec, and the etch rate of the conventional silicon nitride may be approximately 14.6 Å/250 sec. In the wet etch process using a LAL solution, the etch rate of the second low-k spacer layer 27A may approximately 0.4 Å/15 sec, and the etch rate of the conventional silicon nitride may be approximately 11.1 Å/15 sec. The LAL solution may include $H_2O$, HF and $NH_4F$. The second low-k spacer layer 27A may have etch resistance to subsequent dry and wet etch processes.

In this manner, since the etch rate of the second low-k spacer layer 27A is smaller than the etch rate of the conventional silicon nitride, a thickness of the second low-k spacer layer 27A may be deposited thin. Accordingly, a thickness of the first low-k spacer layer 26A may be increased to additionally contribute to a reduction in the parasitic capacitance.

As described above, one first low-k spacer layer 26A may be formed on the side walls of the bit line contact plug 22. A bilayer including the first low-k spacer layer 26A and the second low-k spacer layer 27A may be formed on the side walls of the bit line 23.

The first low-k spacer layer 26A may have a lower dielectric constant than the second low-k spacer layer 27A. The second low-k spacer layer 27A may be referred to as a "low-k spacer layer", and the first low-k spacer layer 26A may be referred to as an "ultra low-k spacer layer".

The first low-k spacer layer 26A and the second low-k spacer layer 27A may be deposited in-situ in ALD apparatus.

Figure 12:
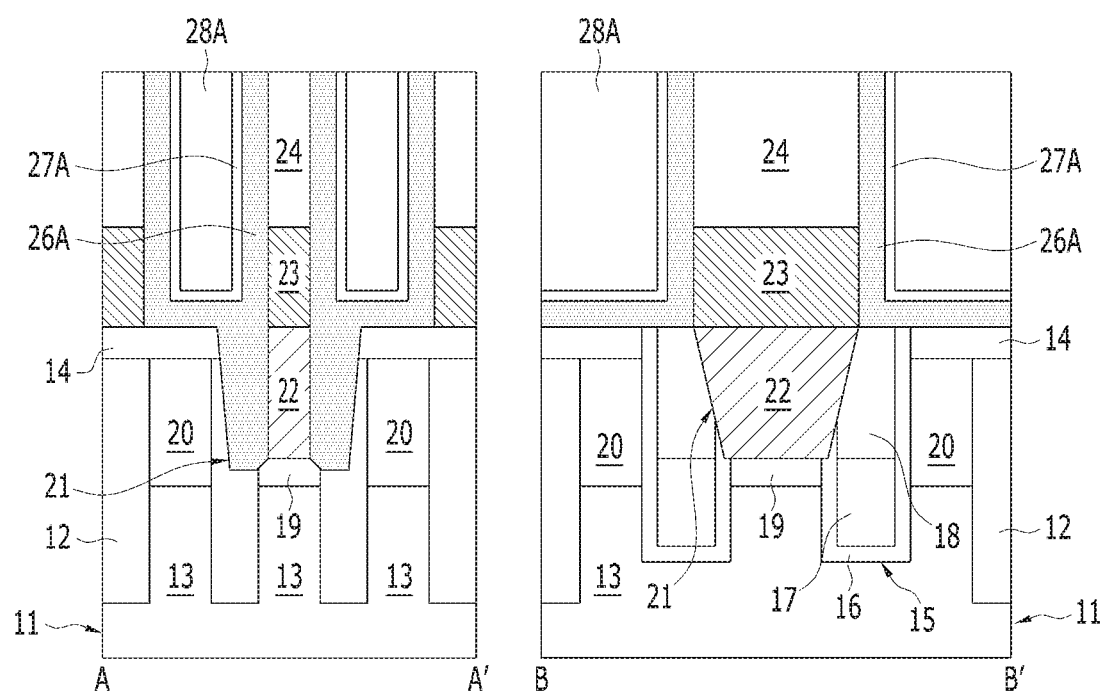

Referring to FIG. 12, a sacrificial layer 28A may be formed. The sacrificial layer 28A may fill a space between the bit line structures. The sacrificial layer 28A may be formed of a dielectric material. For example, the sacrificial layer 28A may be formed of a silicon oxide. The sacrificial layer 28A may include a spin-on dielectric (SOD) material. Subsequently, the sacrificial layer 28A may be planarized to expose a top portion of the bit line hard mask 24. As a result, the sacrificial layer 28A having a line shape may be formed between the bit line structures. The sacrificial layer 28A may be extended parallel to the bit line structures. During a planarization process of the sacrificial layer 28A, the first low-k spacer layer 26A and the second low-k spacer layer 27A may be planarized to expose the top surface of the bit line hard mask 24. In a plan view, the first low-k spacer layer 26A and the second low-k spacer layer 27A may have a line shape extending parallel to the side walls of the bit line 23.

Figure 13:
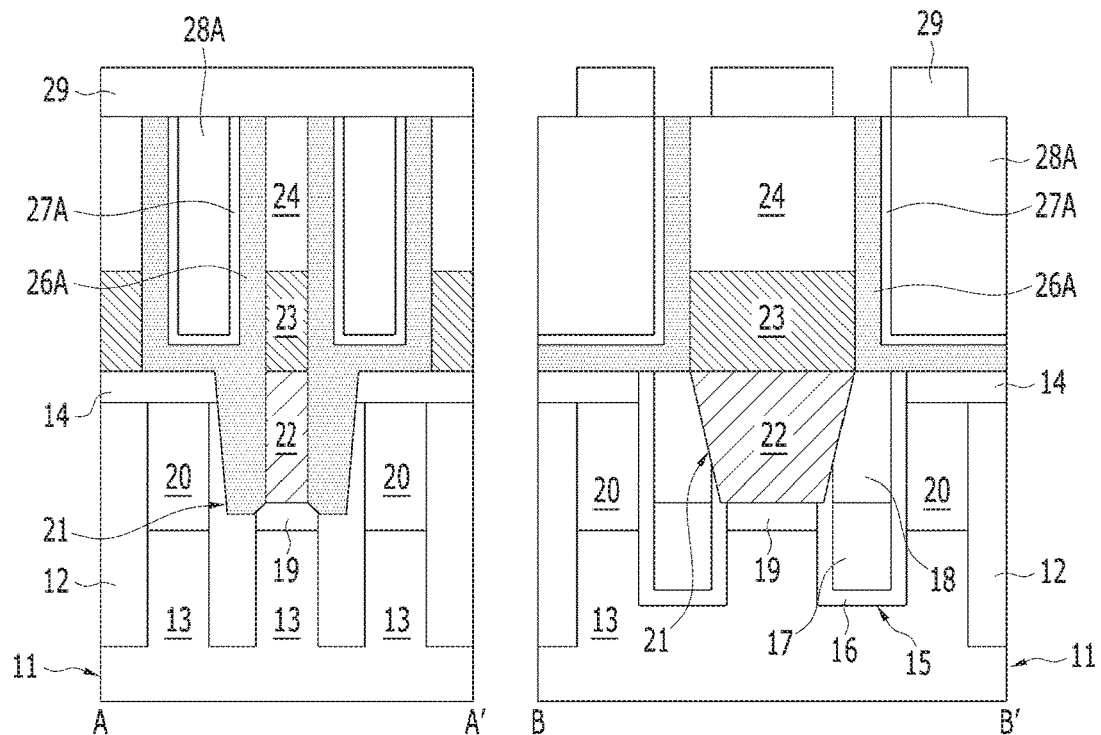

Referring to FIG. 13, a line-type mask pattern 29 may be formed on the bit line structure and the sacrificial layer 28A. The line-type mask pattern 29 may be patterned in a direction intersecting the bit line structure. The line-type mask pattern 29 may have a line shape. The line-type mask pattern 29 may include a photoresist pattern. The line-type mask pattern 29 may have a line/space shape. In a plan view, a space of the line-type mask pattern 29 may overlap the buried word line 17. A top surface of the sacrificial layer 28A may be partially exposed by the line-type mask pattern 29.

Figure 14:
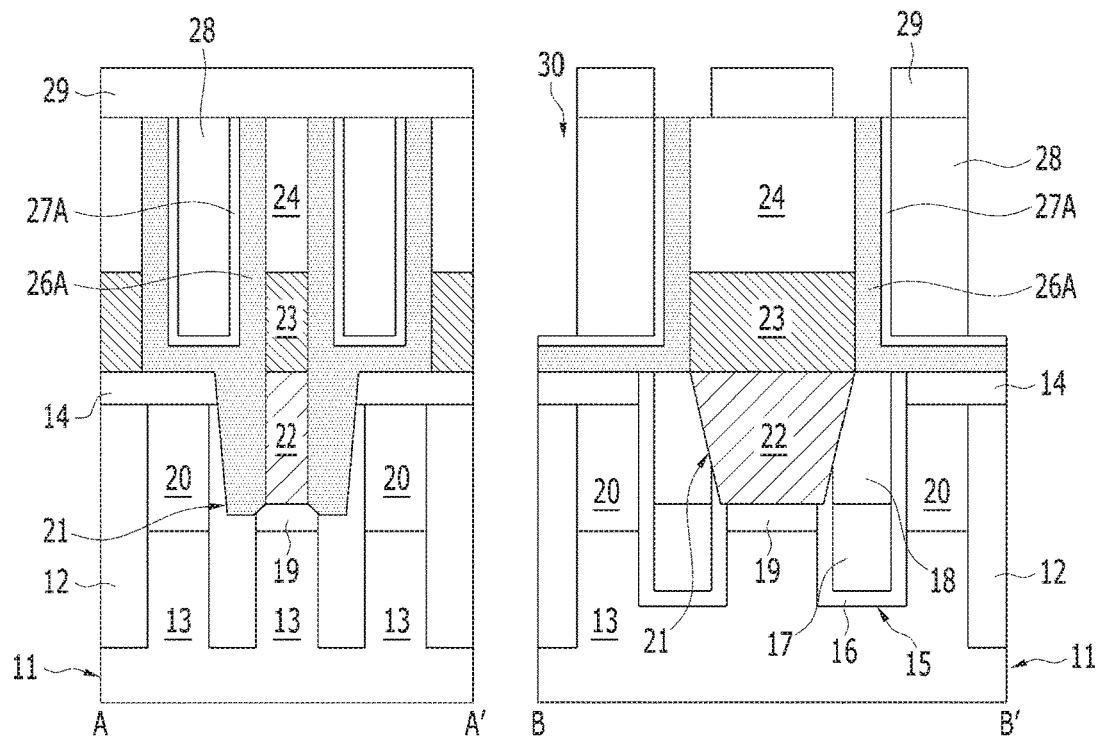

Referring to FIG. 14, a pre-isolation part 30 may be formed in the sacrificial layer 28A. The sacrificial layer 28A may be etched using the line-type mask pattern 29 as an etch mask. As a result, the pre-isolation part 30 may be formed, and a sacrificial pattern 28 may remain between neighboring pre-isolation parts 30.

In a plan view, the pre-isolation part 30 may overlap the buried word line 17. In some embodiments, the pre-isolation part 30 may have a smaller line width than the buried word line 17.

Figure 15:
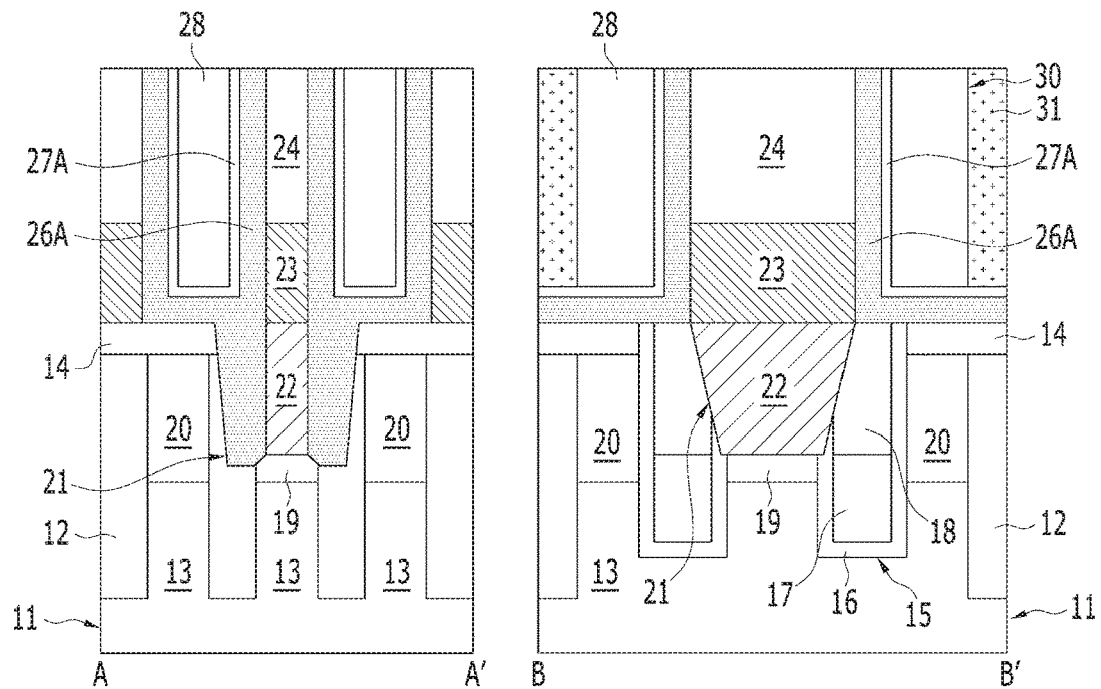

Referring to FIG. 15, the line-type mask pattern 29 may be removed. A plug isolation layer 31 may be formed in the pre-isolation part 30. After a silicon nitride is formed to gap-fill the pre-isolation part 30, the plug isolation layer 31 may be formed by removing any excess silicon nitride by using the planarization process. The plug isolation layer 31 may be formed between the bit line structures in the direction intersecting the bit line structure. The sacrificial pattern 28 may be formed between the bit line structures in the direction intersecting the bit line structure. The plug isolation layer 31 and the sacrificial pattern 28 may be alternately located in a direction parallel to the bit line structure. The plug isolation layer 31 may fill the pre-isolation part 30.

The plug isolation layer 31 and the second low-k spacer layer 27A may have an etch selectivity over the sacrificial pattern 28.

Figure 16:
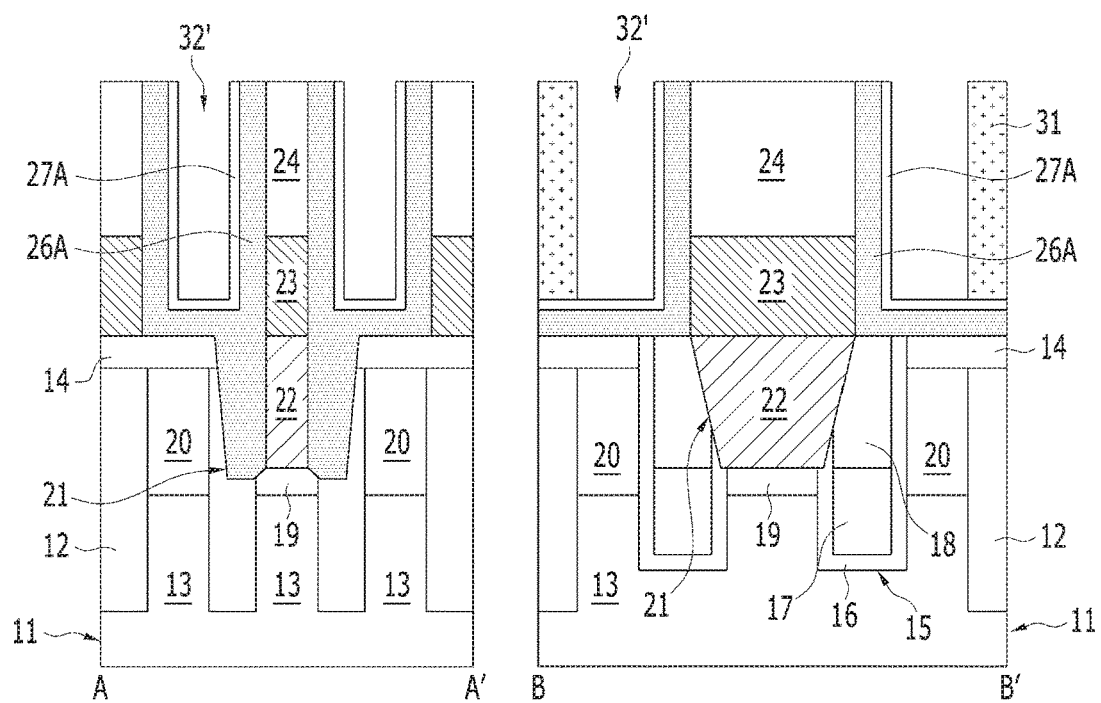

Referring to FIG. 16, the sacrificial pattern 28 may be removed. A space where the sacrificial pattern 28 is removed may become a preliminary second contact hole 32'. In the direction parallel to the bit line structure, the preliminary second contact hole 32' and the plug isolation layer 31 may be alternately formed. Neighboring preliminary second contact holes 32' may be arranged to have a shape isolated by the bit line structure and the plug isolation layer 31. In a plan view, the preliminary second contact hole 32' may have a rectangular hole shape.

In order to remove the sacrificial pattern 28, a dip-out process may be performed. Through the dip-out process, the sacrificial pattern 28 may be selectively removed without a loss of the first low-k spacer layer 26A and the second low-k spacer layer 27A.

Figure 17:
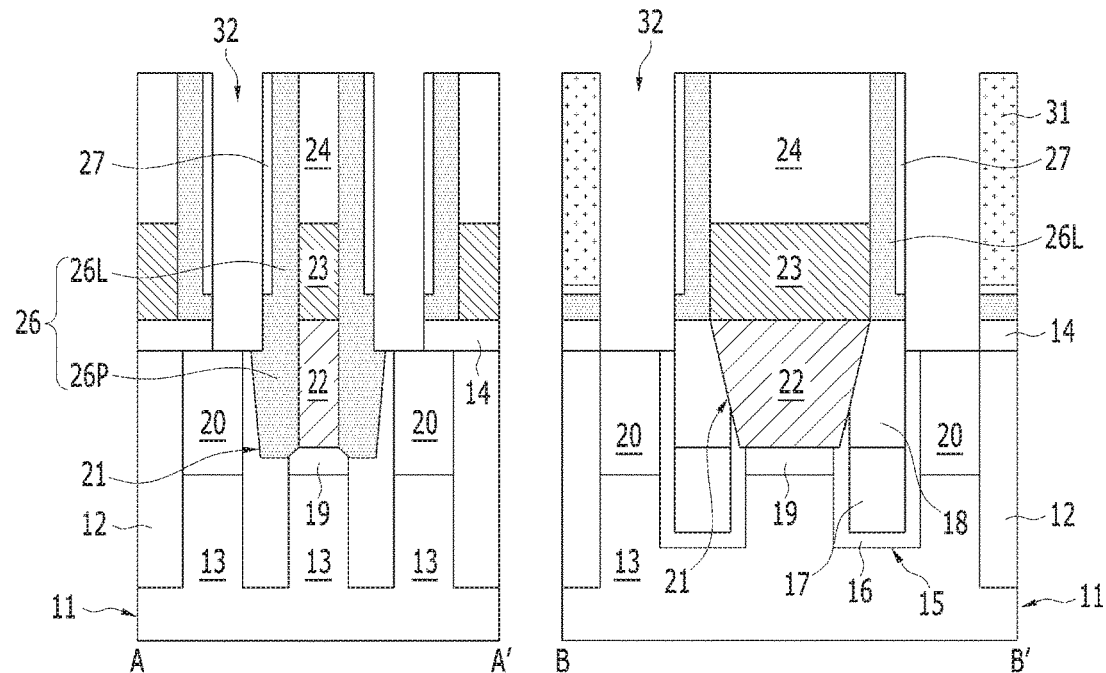

Referring to FIG. 17, bottom materials may be etched to be self-aligned in the preliminary second contact hole 32'. As a result, a second contact hole 32 may be formed. The second contact hole 32 may have a downwardly extending shape of the preliminary second contact hole 32'.

In order to form the second contact hole 32, the second low-k spacer layer 27A, the first low-k spacer layer 26A and the hard mask layer 14 below the preliminary second contact hole 32' may be sequentially etched. The second contact hole 32 may expose a surface of the substrate 11.

A bottom of the second contact hole 32 may be extended into the substrate 11. While the second contact hole 32 is formed, the isolation layer 12, the gate capping layer 18 and the second impurity region 20 may be recessed up to a predetermined depth. A bottom surface of the second contact hole 32 may be at a lower level than a top surface of the bit line contact plug 22. The bottom surface of the second contact hole 32 may be at a higher level than a bottom surface of the bit line contact plug 22. The second contact hole 32 may be referred to as a "storage node contact hole".

A plurality of spacers may be formed on both side walls of the bit line structure through an etch process for forming the second contact hole 32. The plurality of spacers may include materials having two or more different dielectric constants.

The plurality of spacers may include a first low-k spacer 26 and a second low-k spacer 27. The first low-k spacer 26 may contact the side walls of the bit line structure. The second low-k spacer 27 may partially cover the first low-k spacer 26. A bottom of the first low-k spacer 26 may not be covered by the second low-k spacer 27.

The first low-k spacer 26 may include a plugging spacer 26P and a line-type spacer 26L. The plugging spacer 26P may be located on bottom side walls of the bit line structure BL, and the line-type spacer 26L may be located on top side walls of the bit line structure BL. The plugging spacer 26P may be located on the side walls of the bit line contact plug 22, and the line-type spacer 26L may be located on the side walls of the bit line 23. The plugging spacer 26P may be thicker than the line-type spacer 26L. The plugging spacer 26P and the line-type spacer 26L may form an integral part. The plugging spacer 26P may be referred to as a "filling spacer" or a "gap-fill spacer".

The first low-k spacer 26 and the second low-k spacer 27 may be sequentially stacked on the side walls of the bit line 23. One first low-k spacer 26 may be formed on the side walls of the bit line contact plug 22. The first low-k spacer 26 may be formed on the side walls of the bit line contact plug 22 and be extended to the side walls of the bit line 23. The line-type spacer 26L and the second low-k spacer 27 may be sequentially stacked on the side walls of the bit line 23. One plugging spacer 26P may be formed on the side walls of the bit line contact plug 22.

The second low-k spacer 27 may be formed by etching the second low-k spacer layer 27A. The first low-k spacer layer 26A may be aligned on side walls of the second low-k spacer 27 and be etched. The first low-k spacer 26 may be formed by etching the first low-k spacer layer 26A.

Since an etch rate of the second low-k spacer layer 27A is low, an etch loss of the second low-k spacer 27 may be suppressed.

Since the first low-k spacer 26 has a lower dielectric constant than the second low-k spacer 27, the first low-k spacer 26 may be referred to as an "ultra low-k spacer".

A double low-k spacer may be formed on the side walls of the bit line 23. A single low-k spacer may be formed on the side walls of the bit line contact plug 22. The double low-k spacer may include the first low-k spacer 26 and the second low-k spacer 27. The single low-k spacer may include the first low-k spacer 26.

The double low-k spacer may have an ultra low-k/low-k (UL-L) structure, and the single low-k spacer may have an ultra low-k (UL) structure. The first low-k spacer 26 may occupy a maximum volume in the double low-k spacer.

Figure 18:
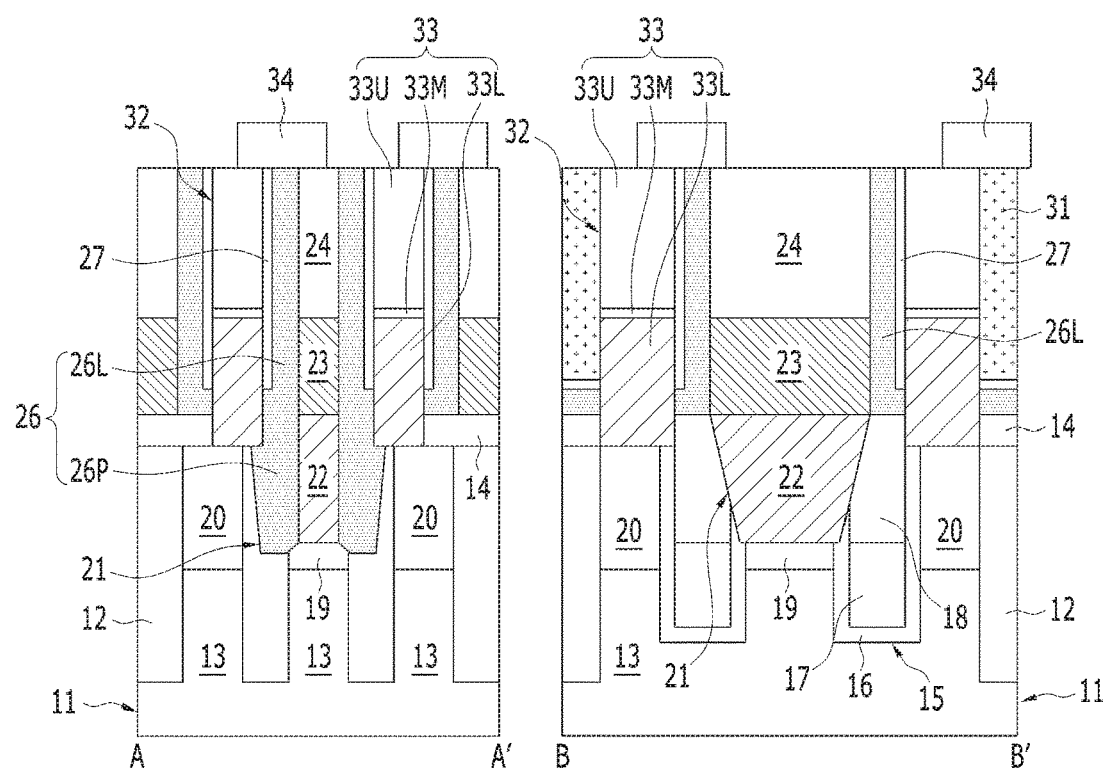

Referring to FIG. 18, a storage node contact plug 33 may be formed. The storage node contact plug 33 may fill the second contact hole 32. The storage node contact plug 33 may contact the second impurity region 20. The storage node contact plug 33 may be adjacent to the bit line structure. When viewed from a top, a plurality of storage node contact plugs 33 may be located between a plurality of bit line structures. In a direction parallel to the bit line 23, the plurality of storage node contact plugs 33 and a plurality of plug isolation layers 31 may be alternately located (refer to FIG. 3).

A bottom plug 33L, an ohmic contact layer 33M and a top plug 33U may be sequentially stacked in the storage node contact plug 33.

The bottom plug 33L may include a silicon-containing material. The bottom plug 33L may include polysilicon. The polysilicon may be doped with an impurity. The bottom plug 33L may be coupled to the second impurity region 20. A top surface of the bottom plug 33L may be higher than a top surface of the bit line 23. In order to form the bottom plug 33L, the polysilicon may be deposited to fill the second contact hole 32, and then the planarization process and the etch-back process may be sequentially performed.

The line-type spacer 26L and the second low-k spacer 27 may be located between the bit line 23 and the bottom plug 33L. The plugging spacer 26P may be located between the bit line contact plug 22 and the bottom plug 33L. The line-type spacer 26L and the second low-k spacer 27 may have the UL-L structure. The plugging spacer 26P may have the UL structure.

The ohmic contact layer 33M may be formed on the bottom plug 33L. The ohmic contact layer 33M may include a metal silicide. In order to form the ohmic contact layer 33M, a deposition process and an annealing process of a silicidable metal layer may be performed. Accordingly, silication may occur at an interface between the silicidable metal layer and the bottom plug 33L, whereby a metal silicide layer may be formed. The ohmic contact layer 33M may include a cobalt silicide. In an embodiment, the ohmic contact layer 33M may include a $CoSi_2$-phase cobalt silicide.

When the $CoSi_2$-phase cobalt silicide is formed as the ohmic contact layer 33M, a cobalt silicide having low resistance may be formed simultaneously while contact resistance is improved.

The top plug 33U may be formed on the ohmic contact layer 33M. In order to form the top plug 33U, a gap-fill process and a planarization process of a metal material (not illustrated) may be performed. The top plug 33U may be formed to fill the second contact hole 32 on the ohmic contact layer 33M. The top plug 33U may include a metal-containing layer. The top plug 33U may include a tungsten-containing material. The top plug 33U may include a tungsten layer or a tungsten compound.

Since the bottom plug 33L includes polysilicon, and the ohmic contact layer 33M and the top plug 33U include a metal material, the storage node contact plug 33 may be referred to as a "hybrid plug" or a "semi-metal plug".

Subsequently, although not illustrated, a memory element 34 may be formed on the top plug 33U.

In accordance with the aforementioned embodiments, as the plugging spacer 26P having an ultra low-k is formed, parasitic capacitance between the bit line contact plug 22 and the storage node contact plug 33 may be reduced. In addition, since only the thick plugging spacer 26P is formed through any other materials which causes a factor of a dielectric constant reduction, the parasitic capacitance between the bit line contact plug 22 and the storage node contact plug 33 may be further reduced.

As the line-type spacer 26L having an ultra low-k and the second low-k spacer 27 having a low-k are formed, parasitic capacitance between the bit line 23 and the storage node contact plug 33 may be reduced. In addition, since the line-type spacer 26L occupies a maximum volume, the parasitic capacitance may be further reduced.

In this manner, since the parasitic capacitance is reduced, a sensing margin of a memory cell may be improved.

In accordance with embodiments of the present invention, a low-k material or an ultra low-k material may be formed, whereby the parasitic capacitance between neighboring pattern structures may decrease.

In accordance with embodiments of the present invention, a low-k material and an ultra low-k material having a lower dielectric constant than a silicon oxide may be formed between a bit line and a storage node contact plug, whereby the parasitic capacitance may decrease.

In accordance with embodiments of the present invention, an ultra low-k material may be formed between a bit line contact plug and a storage node contact plug, whereby the parasitic capacitance may decrease.

While the present invention has been described with respect to specific embodiments, it should be noted that the embodiments are for describing, not limiting, the present invention. Further, it should be noted that the present invention may be achieved in various ways through substitution, change, and modification, by those skilled in the art without departing from the scope of the present invention as defined by the following claims.

What is claimed is:

1. A semiconductor device, comprising:
a bit line structure including a bit line contact plug and a bit line on the bit line contact plug;
a storage node contact plug;
a carbon-free boron containing spacer including a gap-fill spacer directly contacting a side wall of the bit line contact plug and a line-type spacer directly contacting a side wall of the bit line; and
a carbon containing spacer formed on the line-type spacer of the carbon-free boron containing spacer to contact the storage node contact plug,
wherein the carbon-free boron containing spacer is thicker than the carbon containing spacer,
wherein the carbon containing spacer has a lower etch rate than a etch rate of a silicon nitride ($Si_3N_4$), and
wherein the carbon-free boron containing spacer has a lower dielectric constant than a dielectric constant of the silicon nitride ($Si_3N_4$) and the carbon containing spacer.

2. The semiconductor device of claim 1, wherein the carbon-free boron containing spacer includes SiBN.

3. The semiconductor device of claim 1, wherein the carbon-containing spacer includes SiC, SiCN or SiBCN.

4. The semiconductor device of claim 1, wherein the line-type spacer of the carbon-free boron containing spacer is thicker than the carbon containing spacer.

5. The semiconductor device of claim 1, wherein the carbon containing spacer is directly contacted with the storage node contact plug.

6. The semiconductor device of claim 1, wherein the line-type spacer includes upper line portion and lower line portion, the lower line portion of the line-type spacer is directly contacted with the storage node contact plug and the bit line.

7. The semiconductor device of claim 1, wherein the carbon containing spacer and the line-type spacer extend in parallel to the bit line.

8. The semiconductor device of claim 1, further comprising:
a plug isolation layer on sidewalls of the storage node contact plug, wherein the plug isolation layer is free of carbon and boron.

9. The semiconductor device of claim 8, wherein the plug isolation layer is formed of a silicon nitride.

10. The semiconductor device of claim 1, further comprising:
a semiconductor substrate including a first impurity region coupled to the bit line contact plug and a second impurity region coupled to the storage node contact plug; and
a dielectric material formed on the semiconductor substrate and including a bit line contact hole that exposes the first impurity region,
wherein the bit line contact hole is filled with the bit line contact plug and the gap-fill spacer contacting both side walls of the bit line contact plug.

11. The semiconductor device of claim 10, further comprising:
a trench formed between the first impurity region and the second impurity region;
a buried word line formed in the trench; and
a memory element formed on the storage node contact plug.

12. A semiconductor device, comprising:
a bit line structure including a bit line contact plug and a bit line on the bit line contact plug;
a storage node contact plug;
a silicon nitride isolation layer on sidewalls of the storage node contact plug;
a gap-fill SiBN spacer directly contacting a side wall of the bit line contact plug;
a line-type SiBN spacer directly contacting a side wall of the bit line; and
a SiBCN spacer formed on the line-type SiBN spacer to contact the storage node contact plug,
wherein the line-type SiBN spacer is thicker than the SiBCN spacer,
wherein the SiBCN spacer has a lower etch rate than a etch rate of the silicon nitride isolation layer, and
wherein the gap-fill SiBN spacer and the line-type SiBN spacer have a lower dielectric constant than a dielectric constant of the silicon nitride isolation layer and the SiBCN spacer.

13. The semiconductor device of claim 12, wherein the gap-fill SiBN spacer and the line-type SiBN spacer are coupled to each other.

14. The semiconductor device of claim 12, wherein the SiBCN spacer and the line-type SiBN spacer extend in parallel to the bit line.

15. The semiconductor device of claim 12, further comprising:
a semiconductor substrate including a first impurity region coupled to the bit line contact plug and a second impurity region coupled to the storage node contact plug; and
a dielectric material formed on the semiconductor substrate and including a bit line contact hole that exposes the first impurity region,
wherein the bit line contact hole is filled with the bit line contact plug and the gap-fill SiBN spacer contacting both side walls of the bit line contact plug.

16. The semiconductor device of claim 15, further comprising:
a trench formed between the first impurity region and the second impurity region;
a buried word line formed in the trench; and
a memory element formed on the storage node contact plug.

* * * * *